US011686750B2

(12) United States Patent
Nishimura

(10) Patent No.: US 11,686,750 B2
(45) Date of Patent: Jun. 27, 2023

(54) MEASUREMENT INSTRUMENT HAVING TIME, FREQUENCY AND LOGIC DOMAIN CHANNELS

(71) Applicant: Keysight Technologies, Inc., Santa Rosa, CA (US)

(72) Inventor: Ken A. Nishimura, Fremont, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 745 days.

(21) Appl. No.: 16/552,522

(22) Filed: Aug. 27, 2019

(65) Prior Publication Data

US 2020/0132741 A1 Apr. 30, 2020

Related U.S. Application Data

(60) Provisional application No. 62/753,685, filed on Oct. 31, 2018.

(51) Int. Cl.
*G01R 23/16* (2006.01)
*G01R 23/02* (2006.01)
*G01R 13/02* (2006.01)

(52) U.S. Cl.
CPC ......... *G01R 23/16* (2013.01); *G01R 13/0236* (2013.01); *G01R 13/0272* (2013.01); *G01R 23/02* (2013.01)

(58) Field of Classification Search
CPC ................ G01R 23/16; G01R 13/0236; G01R 13/0272; G01R 23/02
USPC ........................................................ 702/77
See application file for complete search history.

(56) References Cited

U.S. PATENT DOCUMENTS

| 2,292,387 | A | 8/1942 | Markey et al. |
| 8,675,719 | B2 | 3/2014 | Dobyns et al. |
| 8,816,673 | B1 | 8/2014 | Barber |
| 8,841,923 | B1 | 9/2014 | Vanwiggeren |
| 2005/0234670 | A1* | 10/2005 | Hagen ................... G06T 11/206 702/85 |
| 2008/0211578 | A1* | 9/2008 | Morishima ........... H02M 3/157 341/143 |
| 2011/0274150 | A1 | 11/2011 | Dement |
| 2012/0078557 | A1* | 3/2012 | Dobyns .............. G01R 13/0236 702/66 |
| 2017/0031029 | A1* | 2/2017 | Pearse ....................... H04L 7/10 |
| 2017/0085408 | A1 | 3/2017 | Yensen et al. |

(Continued)

FOREIGN PATENT DOCUMENTS

| CN | 102435846 A | 5/2012 |
| EP | 1816480 B1 | 12/2016 |
| WO | 2008050928 A1 | 5/2008 |

OTHER PUBLICATIONS

English translation of EP1816480 dated Dec. 7, 2016, 4 pgs.

(Continued)

*Primary Examiner* — Michael P Nghiem

(57) ABSTRACT

An oscilloscope includes a time domain input, a logic domain input, and a frequency domain input. The time domain input provides a time domain input signal in a time domain as a first input signal. The logic domain input provides logic level input as a second input signal. The logic level input includes logic levels over time. The frequency domain input provides a third input signal through frequency downconversion.

6 Claims, 8 Drawing Sheets

(56) References Cited

U.S. PATENT DOCUMENTS

2017/0317792 A1 11/2017 Barich
2019/0064233 A1* 2/2019 Grimm .............. G01R 13/0218

OTHER PUBLICATIONS

Chinese Office Action dated Jan. 5, 2023, 9 pgs.
English translation of Chinese Office Action and Search Report dated Jan. 5, 2023, 10 pgs.

* cited by examiner

MEASUREMENT INSTRUMENT HAVING TIME, FREQUENCY AND LOGIC DOMAIN CHANNELS

CROSS-REFERENCE TO RELATED APPLICATIONS

This present application is claims priority under 35 U.S.C. § 119(e) from U.S. Provisional Application 62/753,685 filed on Oct. 31, 2018, which names Ken A. Nishimura as the inventor. The entire disclosure of U.S. Provisional Application 62/753,685 is specifically incorporated herein by reference.

BACKGROUND

Generally, electromagnetic signals, including radio frequency (RF) signals, may be captured and represented in the time domain and the frequency domain. Representation in the time domain shows the amplitude of the signals versus time, and representation in the frequency domain shows the amplitude of the signals versus frequency. Traditionally, an oscilloscope is used to represent signals in the time domain, and a spectrum analyzer is used to represent signals in the frequency domain. However, oscilloscopes can now represent signals in the frequency domain, as well, by performing a fast Fourier transform (FFT) of a time domain signal, and displaying the frequency spectrum of a captured signal in addition to, or in lieu of a time-domain representation.

These oscilloscopes, referred to as "multi-domain oscilloscopes," include a separate frequency domain channel, in addition to a time domain channel. In a multi-domain oscilloscope, the frequency domain channel includes analog frequency downconversion, with optional filtering of incoming signals prior to digitization, in order to improve fidelity of the captured waveform. This is an alternative to performing an FFT on a captured time domain signal in a time domain channel. As an alternative to analog frequency downconversion, wideband digitization can be performed in the frequency domain channel, commonly referred to as digital down-conversion (DDC), which is typically followed by filtering and decimation.

However, frequency domain and time domain channels suffer from frequency limitations. Typically, wideband analog frequency translation stages are limited in input frequency to a few GHz. Extending the range requires careful frequency planning, which may result in an implementation beyond the scope of a time domain instrument. Digital down-conversion requires that the digitizer be able to process the full bandwidth of the incoming signal. The bandwidth may necessarily be greater than the instantaneous bandwidth. For example, a 1 GHz bandwidth signal centered at 10 GHz requires a digitizer capable of 10.5 GHz signals (21 GSa/s) to DDC, as opposed to a 2 GSa/s digitizer. Neither is amenable to a mmWave system where the input frequencies are typically between 60 and 90 GHz or more.

Wideband oscilloscopes are well suited for analysis of mmWave RF signals, since the bandwidths of interest of mmWave RF signals exceed the bandwidth capabilities of typical frequency domain instruments, such as conventional spectrum analyzers. For example, the 60 GHz unlicensed band extends from about 57 GHz to about 64 GHz (7 GHz of analysis bandwidth), and automotive RADAR extends from about 76 GHz to about 81 GHz (5 GHz of analysis bandwidth). In comparison, most spectrum analyzers are limited to 2 GHz of analysis bandwidth, and are therefore not helpful. Accordingly, in order to perform frequency domain analysis of such wideband RF signals, a wideband oscilloscope may be used in FFT mode. Because of the high carrier frequency of mmWave RF signals, direct digitization requires a very high sampling rate in the digitizer to satisfy the Nyquist criterion, and is not a practical option for most inexpensive oscilloscopes. Similarly, a general purpose analog downconverter for performing frequency down conversion on a frequency domain signal is unlikely to have sufficient performance at these frequencies. Rather, because of the banded characteristics of these systems, optimized mixers or downconverters are utilized for each band of interest. Therefore, what is needed is a convenient source of a signal to act as the downconverting LO for the chosen mixer.

BRIEF SUMMARY

According to representative embodiments, a measurement apparatus includes a time domain receiver configured to receive a time domain input signal in a time domain; a logic domain receiver configured to receive a logical signal comprising logic levels over time; and a frequency domain receiver configured to receive a frequency domain signal in a frequency domain through frequency downconversion. The measurement apparatus may further include a controller coupled to the logic domain input to determine the logic levels over time as determined logic levels.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
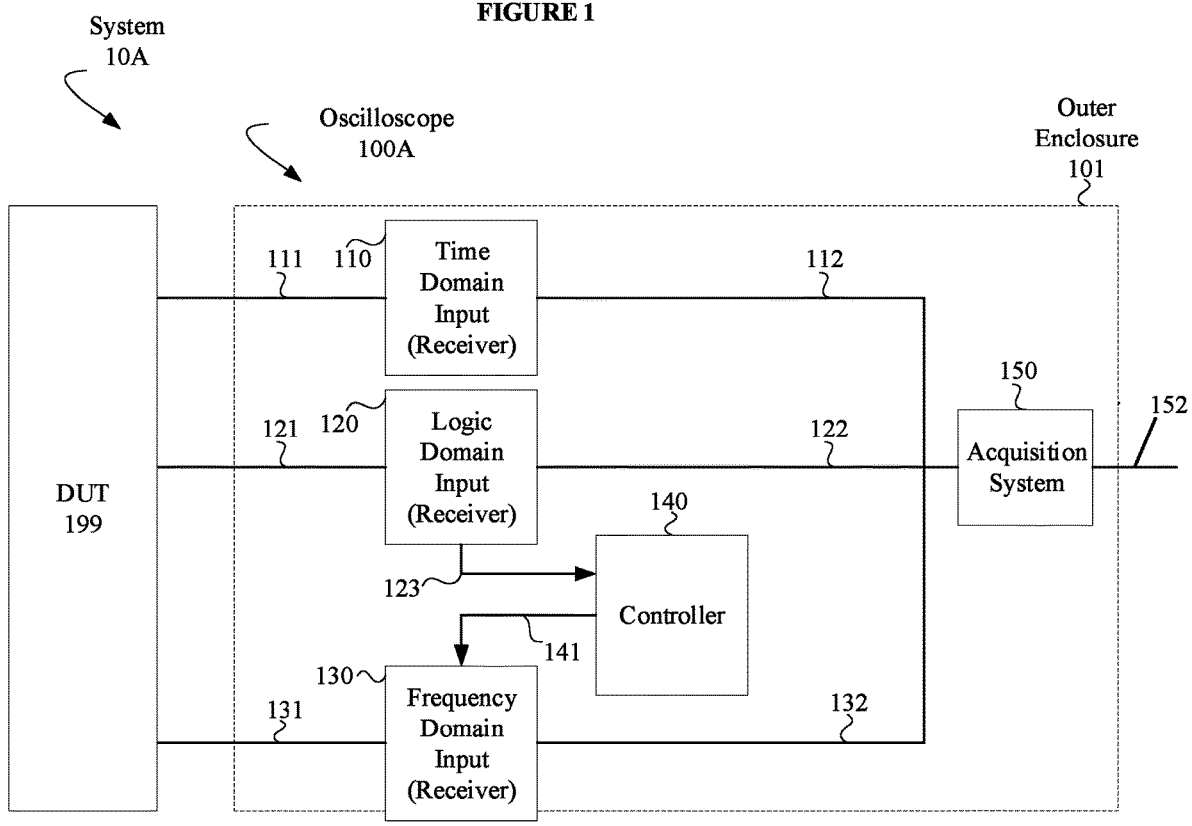
FIG. 1 illustrates a system that includes a measurement instrument having time, frequency and logic domain channels, in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only, and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

FIG. 1 illustrates a system that includes a measurement instrument having time, frequency and logic domain channels, in accordance with a representative embodiment.

In FIG. 1, the system 10A includes a measurement instrument, such as oscilloscope 100A having time, frequency and logic domain channels for measuring signals from a DUT 199 (device under test). The DUT 199 in FIG. 1 is representative of a communications device that emits signals in any or all of a time domain channel, a frequency domain channel, and/or a logic domain channel. An example of the DUT 199 in FIG. 1 is a mobile device such as a cellular telephone. The oscilloscope 100A in FIG. 1 is an oscilloscope system representative of a measurement instrument (or measurement apparatus) having time, frequency and logic domain channels. The oscilloscope 100A in FIG. 1 is used to measure the signals from the DUT 199, including signals in the time domain channel, the frequency domain channel, and/or the logic domain channel. In alternative embodiments, the measurement instrument may have a time domain channel and either a frequency domain channel or a logic domain channel, without departing from the scope of the present teachings. The frequency domain channel may be optimized to deal with an analysis bandwidth that may be a small fraction of the actual frequency of the signal (e.g. the carrier frequency of a mmWave signal).

The oscilloscope 100A includes a time domain input 110 (e.g., time domain channel, including a receiver), a logic domain input 120 (e.g., logic domain channel, including a receiver), a frequency domain input 130 (e.g., frequency domain channel, including a receiver), a controller 140, an acquisition system 150, and an outer enclosure 101. The time domain input 110 (receiver) receives DUT time domain output signal 111 from the DUT 199 and may include a time domain receiver and/or other elements used to process the DUT time domain output signal 111 in the time domain channel. The time domain input 110 may include elements such as analog-to-digital converters, comparators, amplifiers, attenuators and digital processing elements such as memories and decimators, as known in the art, and configured to sample the DUT time domain output signal 111 for analysis in the time domain.

The logic domain input 120 (receiver) receives a DUT logic domain output signal 121 (logical signals) from the DUT 199 and may include a logic domain receiver and/or other elements used to process the DUT logic domain output signal 121 (logical signals) in the logic domain channel. The frequency domain input 130 (receiver) receives the DUT frequency domain output signal 131 from the DUT 199 and may include a frequency domain receiver and/or other elements used to process the DUT frequency domain output signal 131 in the frequency domain channel, as known in the art.

The time domain input 110 provides a time domain input signal 112 in a time domain as a first input signal. The logic domain input 120 provides a logic level input signal 122 as a second input signal. Generally, the logic domain input 120 is configured to capture a signal, and ascertain a digital value represented by the signal. In some embodiments, the logic domain input 120 may be considered a one-bit quantizer, where the signal is interpreted as a logic zero when the input is below a threshold and as a logic one when the input is above the threshold. The frequency domain input 130 provides a frequency domain input signal 132 as a third input signal through frequency downconversion. One or more of the time domain input 110, the logic domain input 120 and the frequency domain input 130 may operate under control of the controller 140. That is, the controller 140 is effectively a common controller enabling a correlated relationship (interoperation) among the time domain input 110, the logic domain input 120 and the frequency domain input 130, such that data from any of the time domain input 110, the logic domain input 120 and the frequency domain input 130 may be used to control and coordinate operations of any others of the time domain input 110, the logic domain input 120 and the frequency domain input 130. Likewise, the controller 140 may control and coordinate operations of the time domain input 110, the logic domain input 120 and the frequency domain input 130 according to common timing.

For example, logic levels of the DUT logic domain output signal 121 (logical signals), which may provide voltage levels, for example, corresponding to digital data values over time, may be used by the controller 140 to trigger functionality of the time domain input 110 and/or the frequency domain input 130. For example, the logic levels may represent one or more parameters of the DUT frequency domain output signal 131, and acquisition of the DUT frequency domain output signal 131 by the frequency domain input 130 may be triggered based on respective states of the logic levels from the DUT logic domain output signal 121. Likewise, the controller 140 may monitor the time domain input 110 and, when it determines a particular signal threshold is exceeded, triggers sampling of the signal (e.g., taking 1024 samples) in the frequency domain input 130. FFT and averaging may then be performed on the samples, as is known in the art. Similarly, a data burst may be sent through the time domain input 110, which is detected by the controller 140, which flags a corresponding portion of the signal from the frequency domain input 130 to be displayed as a frequency spectrum. Also, the frequency domain input 130 may be acquired based on acquisition frequencies, discussed below, set in advance by the logic levels of the DUT logic domain output signal 121. The logic level input signal 122 may, for example, represent a variable center frequency for communications from the DUT 199.

The controller 140 may include a memory that stores instructions and a processor that executes the instructions. An example of the controller 140 is illustrated in and described with respect to FIG. 5 below. The controller 140 is coupled physically and/or logically (e.g., by a data connection) to the logic domain input 120 to determine the logic levels of the logic level input over time. The frequency domain input 130 is controlled by the controller 140 to provide the frequency domain input signal 132 (third input signal) through frequency downconversion. For example, at least one parameter of the frequency domain input signal 132 (third input signal) may be controlled by control signals 141 determined by the controller 140 in response to the logic levels from the logic domain input 120 such that the at least one parameter may then be provided to the frequency domain input 130. Although the controller 140 is shown internal to the oscilloscope 100A, the controller 140 may be implemented by a processor or other control device that is outside the oscilloscope 100A, such as a personal computer (PC) or a workstation, for example, without departing from the scope of the present teachings.

The acquisition system 150 acquires time domain input signal 112 from the time domain input 110, logic level input signal 122 from the logic domain input 120, and frequency domain input signal 132 from the frequency domain input 130. The acquisition system 150 produces oscilloscope output(s) 152 based on one or more of the time domain input signal 112 (first input signal), the logic level input signal 122 (second input signal) and the frequency domain input signal 132 (third input signal) acquired by the acquisition system 150 from the time domain input 110, the logic domain input 120 and the frequency domain input 130. The oscilloscope output(s) 152 may be provided to a display processor, which formats the oscilloscope output(s) 152 for display on a display device (not shown in FIG. 1). For example, each of the time domain input signal 112 and the logic level input signal 122 may be displayed as amplitude (voltage) over time, where the logic level input signal 122 in particular is displayed as a stream of high and low voltage values corresponding to the logic levels of the logic level input signal 122.

The at least one parameter of the frequency domain input signal 132 (third input signal) controlled by the controller 140 may be an acquisition frequency, which is the range of frequencies of the signal from the DUT to which the oscilloscope 100A (e.g., the acquisition system 150) is responsive after downconversion of the DUT frequency domain output signal 131 to the frequency domain input signal 132. The downconversion is a function of a local oscillator (LO) frequency of the LO signal provided by a LO signal generator, which may be controlled by the controller 140, as discussed below with reference to FIGS. 2-4. In particular, a mixer mixes an input signal, such as the DUT frequency domain output signal 131, and the LO signal to provide an intermediate frequency (IF) signal having a downconverted frequency. The value of the downconverted frequency is adjustable as a function of the value of the LO frequency, which may be determined by the controller 140. In terms of the mixer, acquisition frequencies are those frequencies applied at the radio frequency (RF) input to the mixer, which after frequency downconversion, appear at the IF output of the mixer within a range of frequencies acceptable by the IF channel (or frequency domain channel).

Another parameter that may be controlled by the controller 140 is the amplitude of the frequency domain input signal 132. To the extent that the mixer is linear, the amplitude of the LO signal will change the amplitude of the resultant IF signal. More generally, it is desired to control the amplitude of the LO signal to be in a relationship with RF amplitude, so that the mixer operates as linearly as possible.

The controller 140 may be coupled to the logic domain input 120 to determine the logic levels of the logic level input signal over time. The controller 140 may then generate control signals 141 in response to the logic levels.

A special case arises when the signal presented at the frequency domain input 130 incorporates spread spectrum processing. Spread spectrum processing is used to distribute the modulated signal across a much wider bandwidth for purposes of evasion or interference mitigation, e.g., as in Wi-Fi or Bluetooth. A specific subset of spread spectrum processing involves frequency hopping, according to which a narrowband signal is "hopped" across a much wider bandwidth according to a predetermined sequence. The predetermined sequence enables alignment of the transmitter and the receiver. The occupied bandwidth at any instant remains narrow, while the center frequency of the DUT frequency domain output signal 131 is updated hundreds or even thousands of times a second, for example. Thus, knowledge of the center frequency at any instant is required in order to analyze the DUT frequency domain output signal 131 without capturing the entire wider bandwidth. That is, the frequency domain channel would not be able to perform any down-conversion as the desired signal could be anywhere within the entire wider bandwidth of the frequency domain channel. Hence the system would not benefit from band-limiting and down-conversion. The frequency hopping may be controlled digitally, e.g., with a digital algorithm providing inputs to the frequency hopping system, such as using a Frequency Control Word (FCW), which represents the center frequency of a hopped signal. Analyzing the FCW will indicate the frequency of the desired signal.

Thus, an example usage of the embodiment of FIG. 1 is when the DUT frequency domain output signal 131 presented at the frequency domain input 130 incorporates spread spectrum processing. In FIG. 1, the center frequency of the desired signal may be controlled according to a predetermined sequence using the logic domain input 120. For example, an algorithm processed by a digital signal processor in the logic domain input 120 or by the controller 140 may provide inputs such as a FCW, representative of the center frequency of a hopped signal. In general, the FCW may be a digital signal on the DUT 199. The controller 140 receives the FCW through the logic domain input 120, where the DUT logic domain output signal 121 may represent the FCW. The digital values of the logic level input signal 122 are interpreted by the controller 140 as the FCW. Alternatively, the controller 140 may be programmed with the same algorithm used to generate the FCW in the DUT 199, and the logic levels of the logic level input signal 122 are used as a time-trigger, or synchronization. The FCW indicates the frequency of the desired signal presented, or to be presented, to the frequency domain input 130. The net result may be that frequency translation is incorporated within the frequency domain input 130 to track the frequency hopping as described by the FCW applied to the logic domain input 120. That is, the frequency hopping component may be removed, thereby minimizing the bandwidth required to analyze the DUT frequency domain output signal 131. This enables the "de-hopped" signal of interest to occupy the intended bandwidth used by the frequency domain input 130. Of course, the digital data presented to the logic domain input 120 is not limited to a FCW or to frequency hopping systems generally.

Figure 2:
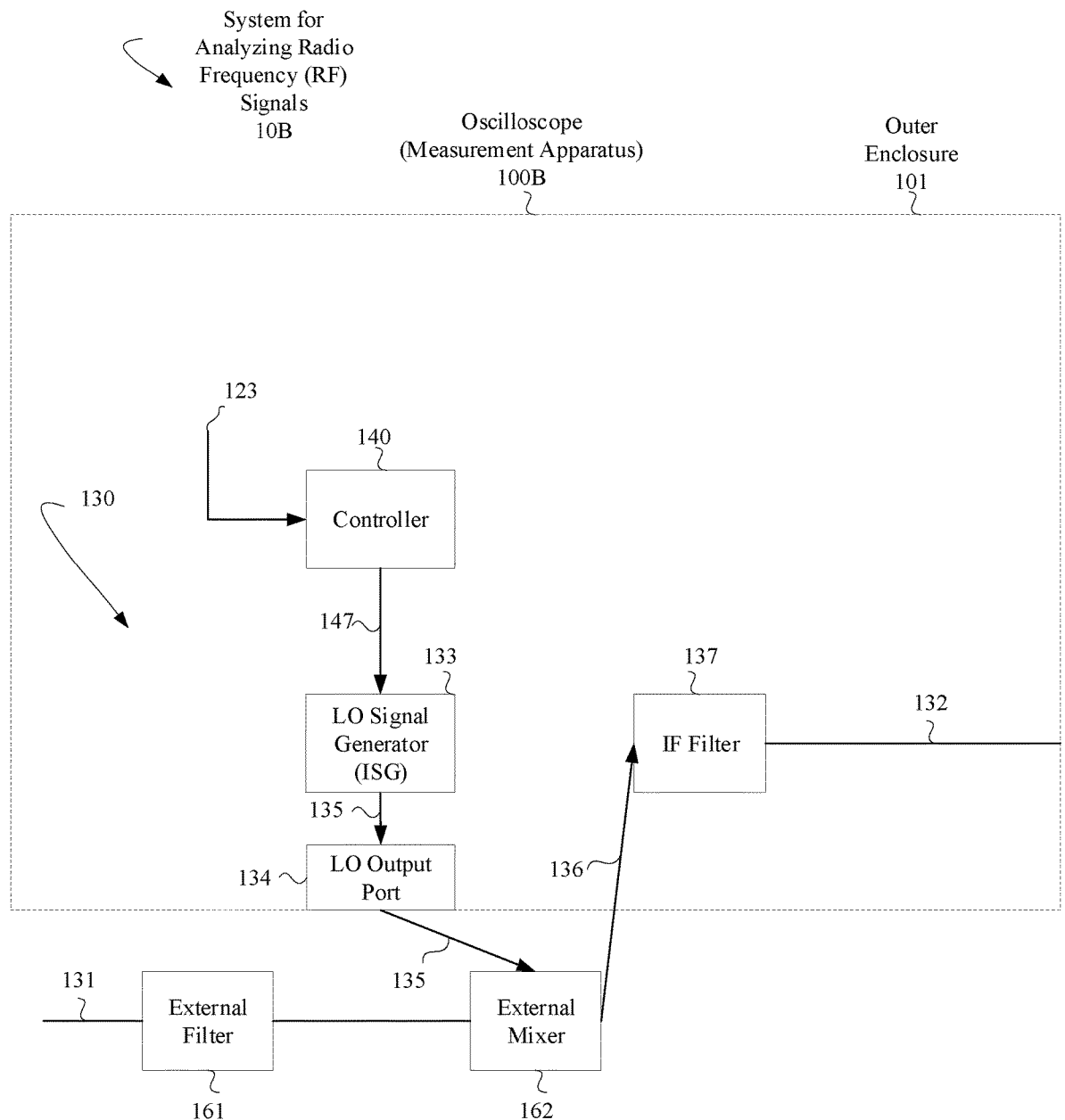
FIG. 2 illustrates another system that includes a measurement instrument having time, frequency and logic domain channels, in accordance with a representative embodiment.

FIG. 2 illustrates another system that includes a measurement instrument having time, frequency and logic domain channels, in accordance with a representative embodiment.

In FIG. 2, a system 10B for analyzing RF signals includes an oscilloscope 100B, an external filter 161 and an external mixer 162. The oscilloscope 100B is a measurement apparatus, and includes at least the same elements of the oscilloscope 100A shown in FIG. 1, although not all of these elements are shown in FIG. 2 for the sake of convenience. The oscilloscope 100B of FIG. 2 additionally details the frequency domain input 130. It is understood, however, that FIG. 2 includes the time domain input 110, the logic domain input 120 and the frequency domain input 130, or any combination of two of the time domain input 110, the logic domain input 120 and the frequency domain input 130, and that the controller 140 may commonly control and coordinate operations of the same.

Specifically, in the embodiment of FIG. 2, the frequency domain input 130 includes an integrated (internal) LO signal generator 133 and a LO output port 134. The external mixer 162 is provided outside the outer enclosure 101 of the oscilloscope 100B. The external mixer 162 receives the DUT frequency domain output signal 131 from the device under test (not shown in FIG. 2) via an external filter 161 which is optional, for example. The external mixer 162 also receives an LO signal 135 from the LO output port 134. The LO signal 135 is generated by the LO signal generator 133, which is provided inside the outer enclosure 101. In an alternative configuration, the LO signal generator 133 may be an external LO signal generator that is provided outside the outer enclosure 101, as is the external mixer 162. In this alternative configuration, the controller 140 may control and coordinate operations in the same manner as with an internal LO signal generator 133, as discussed below with reference to FIG. 3. The LO signal generator 133 provides the LO signal 135 to the LO output port 134, and the LO output port 134 provides the LO signal 135 to the external mixer 162. The output of the external mixer 162 is a frequency downconverted intermediate frequency (IF) signal 136. The frequency downconverted IF signal 136 is provided to an IF filter 137, which is optional and which provides the (filtered) frequency domain input signal 132 as an output.

Characteristics of the LO signal 135 may be controlled based on LO control signals 147 from the controller 140, and the external mixer 162 may generate the frequency downconverted IF signal 136 based on the LO signal 135, as discussed above. In an illustrative implementation of FIG. 2, logic levels (i.e., from the logic domain input 120) may be provided to the controller 140, and in response, the controller 140 may output the LO control signals 147 to the LO signal generator 133 to control the characteristics of the LO signal 135 generated by the LO signal generator 133 based on the logic levels.

Figure 3:
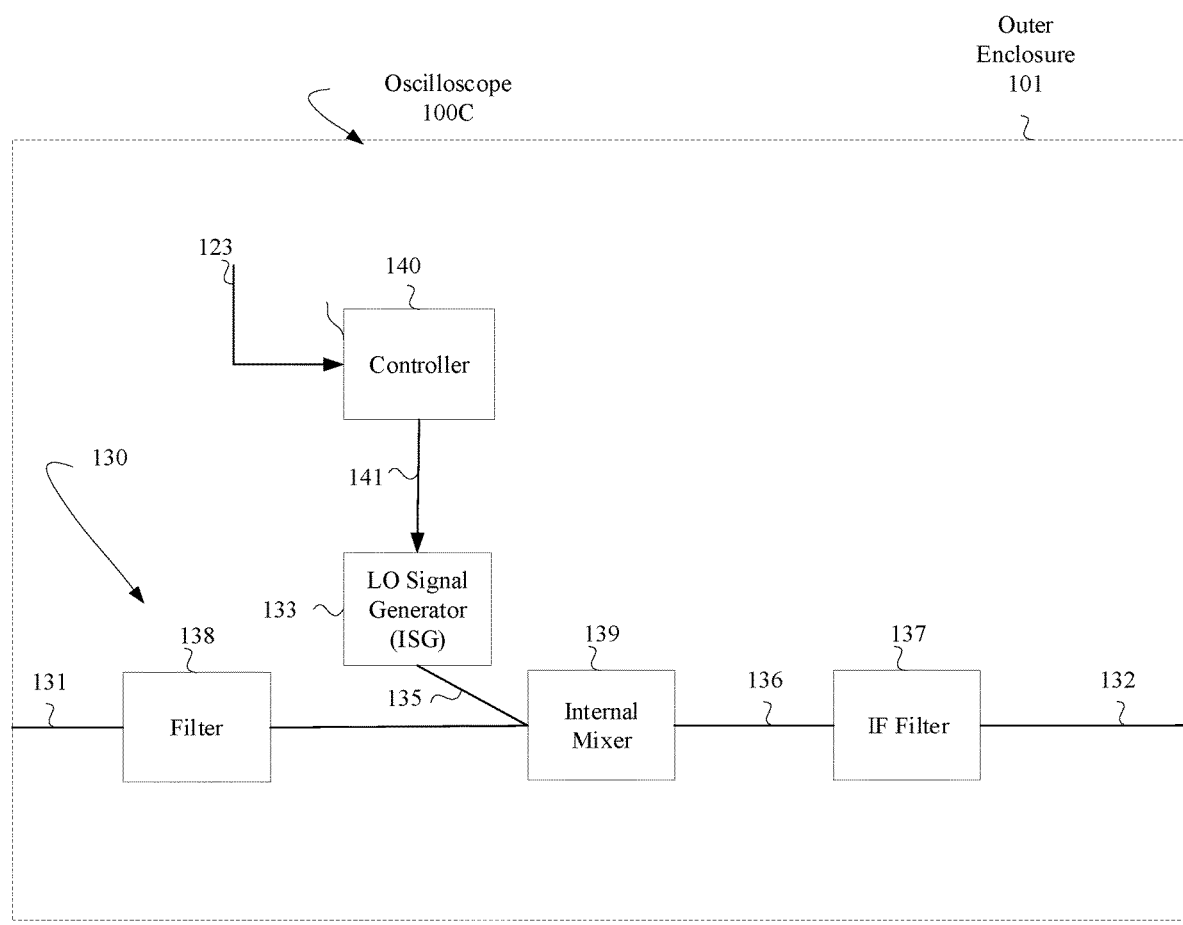
FIG. 3 illustrates a measurement instrument having time, frequency and logic domain channels, in accordance with a representative embodiment.

FIG. 3 illustrates a measurement instrument having time, frequency and logic domain channels, in accordance with a representative embodiment.

In FIG. 3, an oscilloscope 100C is a measurement apparatus. The oscilloscope 100C includes at least the same elements of the oscilloscope 100A shown in FIG. 1, although not all of these elements are shown in FIG. 3 for the sake of convenience. The oscilloscope 100C in FIG. 3 also details the frequency domain input 130. It is understood, however, that FIG. 3 includes the time domain input 110, the logic domain input 120 and the frequency domain input 130, or any combination of two of the time domain input 110, the logic domain input 120 and the frequency domain input 130, and that the controller 140 may commonly control and coordinate operations of the same.

Specifically, in the embodiment of FIG. 3, the frequency domain input 130 includes a filter 138 which is optional, an internal LO signal generator 133, an internal mixer 139, and an optional IF filter 137. The internal LO signal generator 133 and the internal mixer 139 are provided within the outer enclosure 101 of the oscilloscope 100C. The internal mixer 139 receives the DUT frequency domain output signal 131 from the device under test (not shown in FIG. 3) via the filter 138. The internal mixer 139 also receives the LO signal 135 from the LO signal generator 133. The LO signal 135 is generated by LO signal generator 133, which is an integrated local oscillator signal generator. The LO signal generator 133 provides the LO signal 135 to the internal mixer 139, e.g., under control of the controller 140. The output of the internal mixer 139 is a frequency downconverted IF signal 136. The frequency downconverted IF signal 136 is provided to an IF filter 137, which outputs the frequency domain input signal 132. The controller 140 controls interoperation among the internal LO signal generator 133, the internal mixer 139 and each of the time domain input 110, the logic domain input 120 and the frequency domain input 130, such that parameters of the internal LO signal generator 133 and/or the internal mixer 139 may be adjusted in response to data from any of the time domain input 110, the logic domain input 120 and the frequency domain input 130, or data from the internal LO signal generator 133 and/or the internal mixer 139 may be used to control operations of the time domain input 110, the logic domain input 120 and the frequency domain input 130. For example, the controller 140 may use prior knowledge of the internal mixer 139 and LO characteristics of the LO signal 135 to avoid bad combinations.

As discussed above, characteristics of the LO signal 135 may be controlled based on control signals 141 from the controller 140, and the internal mixer 139 may generate the frequency downconverted IF signal 136 based on the LO signal 135, as discussed above. In an illustrative implementation of FIG. 3, logic levels (i.e., from the logic domain input 120) may be provided to the controller 140, and the controller 140 may output the control signals 141 in response to the logic levels to the LO signal generator 133. The LO signal generator 133 generates the LO signal 135 based on the control signals 141 from the controller 140. In the embodiment of FIG. 3, all of the functionality of the frequency domain input 130, including the internal mixer 139, is provided within the outer enclosure 101 of the oscilloscope 100C.

Figure 4:
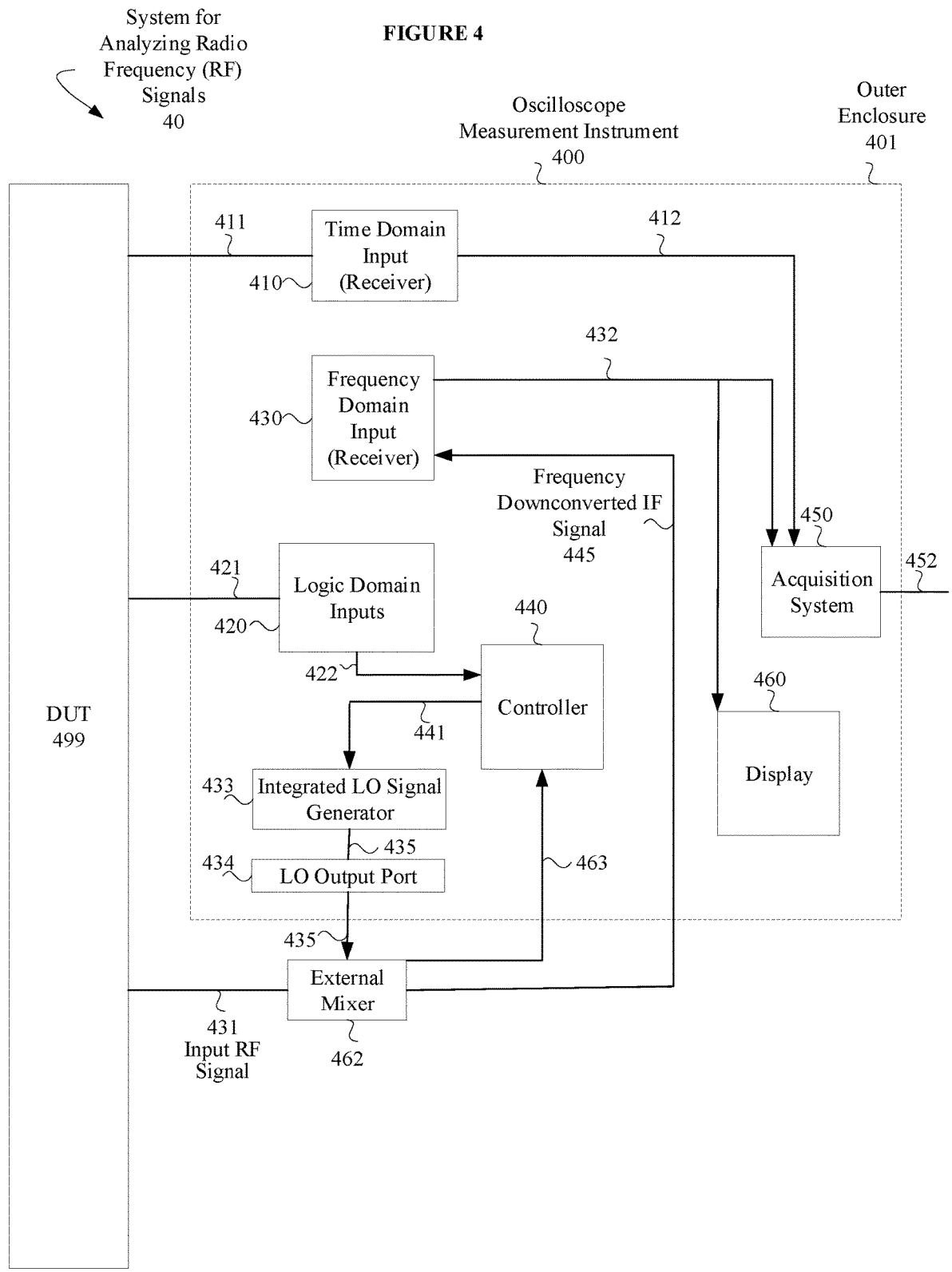
FIG. 4 illustrates another system that includes a measurement instrument having at least time and frequency domain channels, an internal local oscillator (LO) signal generator and LO port, in accordance with a representative embodiment.

FIG. 4 illustrates another system that includes a measurement instrument having at least time and frequency domain channels, internal (integrated) LO signal generator and LO port, in accordance with a representative embodiment.

In FIG. 4, system 40 for analyzing signals includes a measurement instrument, such as oscilloscope 400, having time, frequency and logic domain channels, and an internal LO signal generator 433, as well as an external mixer 462. A DUT 499 (device under test) in FIG. 4 is representative of a communications device that emits signals in any or all of an analog time domain channel, a frequency domain channel, and/or digital time domain (logic) channels. An example of the DUT 499 in FIG. 4 is a mobile device such as a cellular telephone. The oscilloscope 400 in FIG. 4 is representative of a measurement apparatus having analog time domain, radio frequency (RF) domain and digital time domain (logic) channels, although other types of measurement instruments may be incorporated without departing from the scope of the present teachings. The oscilloscope 400 in FIG. 4 is used to measure and/or display the signals from the DUT 499, including signals in the analog time domain channel, the radio frequency domain channel, and/or the digital time domain (logic) channels. In alternative embodiments, the measurement instrument may have a time domain channel and a frequency domain channel, and no logic domain channel, without departing from the scope of the present teachings.

In FIG. 4, the oscilloscope 400 includes at least a time domain input 410 (e.g., time domain channel, including a receiver), a frequency domain input 430 (e.g., frequency domain channel, including a receiver), an acquisition system 450, an outer enclosure 401, an integrated LO signal generator 433, a LO output port 434 (local oscillator output port), a controller 440, and a display 460. In an embodiment, the oscilloscope 400 may further include a logic domain input 420 (e.g., logic domain channel, including a receiver). The outer enclosure 401 may be a housing that houses at least all of the elements of the oscilloscope measurement instrument shown in FIG. 4.

The time domain input 410 (receiver) receives analog DUT time domain output signal 411 from the DUT 499 and may include a time domain receiver and/or other elements used to process the analog DUT time domain output signal 411 in the analog time domain channel. The time domain input 410 provides an analog time domain input signal 412 as an output. The time domain input 410 provides the analog time domain input signal 412 in a time domain as a first input signal. The logic domain input 420 (receiver) receives a logic domain signal 421 (logical signals) from the DUT 499 and may include a logic domain receiver and/or other elements used to process the logic domain signal 421 (logical signals) in the logic domain channel. The logic domain signal 421 has logic levels determined by the logic domain input 420. The logic domain input 420 provides a logic level input signal 422 as a second input signal.

The frequency domain input 430 (receiver) indirectly receives RF signal 431 output from the DUT 499 via the external mixer 462 after the external mixer 462 downconverts the RF signal 431 to produce frequency downconverted IF signal 445. The frequency domain signal may be mmWave radio frequency signal, for example. The frequency domain input 430 receives the frequency downconverted IF signal 445 and provides a frequency domain input signal 432 as an output. The frequency domain input 430 may include a frequency domain receiver and/or other elements used to process the frequency downconverted IF signal 445.

The frequency domain input 430 may be controlled by the controller 440 to provide the frequency domain input signal 432 as a third input signal through the frequency downconversion. For example, at least one parameter of the frequency domain input signal 432 (third input signal) may be controlled by control signals (not shown in FIG. 4) determined by the controller 440 in response to the logic levels of the logic domain signal 421. That is, the controller 440 may control the frequency domain input 430 based on logic levels provided by the logic domain input 420 (logical signals) over time. The at least one parameter of the frequency domain input signal 432 controlled by the controller 440 may be an acquisition frequency of the frequency domain input signal 432, which is subject to frequency downconversion.

Generally, the controller 440 controls interoperation among the internal LO signal generator 433, the external mixer 462 and each of the time domain input 410, the logic domain input 420 and the frequency domain input 430, such that parameters of the internal LO signal generator 433 and/or the external mixer 462 may be adjusted in response to data from any of the time domain input 410, the logic domain input 420 and the frequency domain input 430, or data from the internal LO signal generator 433 and/or the external mixer 462 may be used to control operations of the time domain input 110, the logic domain input 120 and the frequency domain input 130.

In addition to controlling interoperation among the time domain input 410, the logic domain input 420 and the frequency domain input 430, as discussed above with reference to FIG. 1, the controller 440 is also programmed to control operations of the integrated LO signal generator 433 using control signals 441. The LO signal generator 433 generates an LO signal 435, e.g., using any of various techniques, such as direct digital synthesis (DDS), fractional-N synthesis, or a combination thereof. The controller 440 may cause the LO signal generator 433 to adjust frequency and/or power of the LO signal 435, for example, in response to various data. For example, the controller 440 may determine the control signals 441 based on the logic levels of the logic domain signal 421 that it receives from the logic domain input 420. In various embodiments, the logic domain signal 421 having logic levels over time may be provided by the DUT 499. The logic levels may represent one or more parameters of the RF signal 431. For example, the logic levels may indicate acquisition frequencies set in advance for acquisition of the RF signal 431 by the frequency domain input 430. Also, for example, the logic domain signal 421 may represent a variable center frequency (e.g., frequency hopping or sweeping, discussed below) for communications from the DUT 499.

The controller 440 may also be programmed to control frequency offsets of the LO signal 435 for spur dodging based on the logic domain signals provided by the DUT 499 when the IF frequency output by the external mixer 462 is not fixed. Spur dodging avoids certain frequency combinations of RF and LO inputs to the external mixer 462 that would result in undesired operation. That is, when the IF frequency of the IF signal 445 has some flexibility, the LO signal 435 may be altered to avoid the spur. The offset in the IF signal 445 may be compensated for in the digital processing subsequent to the FFT, for example. When the LO frequency is moved up by X to avoid a spur, all the downconverted frequencies of the IF signal 445 will also be higher by X (assuming use of a superheterodyne receiver), and thus the digital processing will need to "subtract" X to obtain the correct frequency measure. The controller 440 may use prior knowledge of the external mixer 462 and LO characteristics of the LO signal 435 to avoid bad combinations. For example, if it is known that the LO signal 435 has a spur and offset frequency Y, the controller 440 may control the LO signal generator 433 to avoid combinations of RF and LO frequencies where the RF signal mixed with the spur will fall into the acquisition frequency band.

Alternatively, or in addition, the controller 440 may determine the control signals 441 based on input from another source, such as a database, an external processor, or another component, including the external mixer 462 itself. For example, the controller 440 may be programmed to receive a characteristic of the external mixer 462, such as desired LO power for a given RF power, conversion gain, known non-idealities (e.g., for spur dodging), through an auxiliary control signal 463 received from the external mixer 462 as a received characteristic, and to adjust the integrated LO signal generator 433 to alter the frequency and/or power of the LO signal 435 in response to the received characteristic. The controller 440 may receive the auxiliary control signal 463 using a separate electrical connection, such ad a simple serial bus, or the external mixer 462 may have a pre-programmed memory that communicates with the controller 440 over USB, for example. Of course, the controller 440 may determine the control signals based on other criteria, without departing from the scope of the present teachings.

With regard to frequency sweeping or hopping of the LO signal 435, the controller 440 may be programmed to synchronously adjust parameters of the LO signal generator 433 in accordance with parameters of the DUT 499 and/or the external mixer 462 to match timing and corresponding frequencies of the sweeping or hopping. That is, attributes of the LO signal generator 433, such as the frequency of the LO signal 435, may be made operative to respond to a specific set of logic levels of the logic domain signal 421. So, for example, the DUT 499 may be an RF device operating at mmWave frequencies and the carrier frequency of the RF signal 431 may be hopped across a wide frequency range, e.g., according to a predetermined frequency hopping plan implemented by the DUT 499. To support the frequency hopping, the frequency of the LO signal 435 may be correspondingly hopped under control of the controller 440 in synchronism with the carrier frequency of the RF signal 431 from the DUT 499. This results in a baseband signal (the IF signal 445) with a center frequency that effectively remains constant, since the LO signal 435 is changed to maintain the same frequency differential whenever the carrier frequency of the RF signal 431 changes. That is, the frequency hopping component is removed, minimizing the bandwidth required to analyze the RF signal 431, and maximizing the achievable signal integrity. The frequency control word that hops the carrier frequency of the RF signal 431 may be probed by the logic domain signal 421 input to the oscilloscope 400. Coupling the LO attribute (e.g., frequency) to the state of the logic domain input 420 enables the LO frequency of the LO signal 435 to hop in response to the frequency control word and achieve the desired results.

The controller 440 may include a memory that stores instructions and a processor that executes the instructions. An example of the controller 440 is illustrated in and described with respect to FIG. 5, below. The controller 440 is coupled physically and/or logically (e.g., by a data connection) to the logic domain input 420 to determine the logic levels of the logic domain signal 421 over time. The controller 440 is programmed to control operation of the integrated LO signal generator 433. In an embodiment, the controller 440 may also be programmed to control operation of the external mixer 462, discussed below. For example, when the external mixer 462 is an active mixer, it may have adjustable gain an amplifier and/or an attenuator stage. In this case, the controller 440 may, after analyzing characteristics of the IF signal 445 applied to the frequency domain input 430, alter effective gain of the external mixer 462 to best match the amplitude of the RF signal 431 and the input characteristics of the frequency domain input 430. When the RF signal 431 is small, gain should be adjusted as early as possible to optimize noise performance, and when the RF signal 431 is large, it should be attenuated to prevent distortion.

Although the controller 440 is shown internal to the oscilloscope 400, the controller 440 may be implemented by a processor, host computer or other control device that is outside the oscilloscope 400, such as a PC or computer workstation, for example, without departing from the scope of the present teachings. That is, the system 40 includes a common control system, such as the controller 440 or a software program executing on a host processor external to the oscilloscope 400, that controls operations of the oscilloscope (e.g., time and/or frequency domain analysis), as well as the LO generator such that the system 40 appears as a unified instrument to the user.

The acquisition system 450 acquires the analog time domain input signal 412 output from the time domain input 410, the logic level input signal 422 output from the logic domain input 420, and the frequency domain input signal 432 output from the frequency domain input 430. The acquisition system 450 produces oscilloscope output(s) 452 based on one or more of the input signals from the time domain input 410, the logic domain input 420 and the frequency domain input 430. The oscilloscope output(s) 452 may be provided to a display processor, which formats the oscilloscope output(s) 452 for display on a display device (not shown). For example, each of the analog time domain input signal 412 and the logic level input signal 422 may be displayed as amplitude (voltage) over time, where the logic level input signal 422 in particular is displayed as a stream of high and low voltage values corresponding to the logic levels of the logic level input signal 422.

The integrated LO signal generator 433 generates the LO signal 435. The integrated LO signal generator 433 is embedded internally within the oscilloscope 400. The integrated LO signal generator 433 may generate the LO signal 435 based on respective states of the logic levels from the logic domain input 420. The LO output port 434 is provided in the oscilloscope 400 for outputting the LO signal 435 generated by the integrated LO signal generator 433 as an output LO signal. The LO signal 435 output from the LO output port 434 as the LO signal 435 is outputted to the external mixer 462.

The external mixer 462 is a frequency mixer that is external to the oscilloscope 400. The external mixer 462 receives the RF signal 431 from the DUT 499 at an RF input, and receives the LO signal 435 from the LO output port 434 at an LO input. The external mixer 462 frequency mixes the RF signal 431 and the LO signal 435 to provide the frequency downconverted IF signal 445 (intermediate frequency signal) at an LO output. The frequency downconverted IF signal 445 has a carrier at a lower frequency then the RF signal 431. For example, the RF signal 431 may have a carrier at a frequency higher than an upper limit of the frequency domain input 430. In this case, the external mixer 462 may be configured to generate the downconverted IF signal 445 to have a carrier at a lower frequency, which is within the limits of the frequency domain input 430. The external mixer 462 may separately provide a characteristic of the external mixer 462 to the controller 440 through the auxiliary control signal 463, as discussed above, so that the controller 440 can use the received characteristic to adjust the integrated LO signal generator 433 to alter the LO signal 435 in response to the received characteristic.

The acquisition system 450 acquires analog time domain input signal 412 from the time domain input 410, and frequency domain input signal 432 from the frequency domain input 430. The acquisition system 450 may also acquire the logic level input signal 422 as a digital time domain input signal, from the logic domain input 420. The acquisition system 450 produces oscilloscope output(s) 452 based on one or more of the input signals acquired by the acquisition system 450 from the time domain input 410, the frequency domain input 430, and/or the logic domain input 420.

The controller 440 may be programed to manage images and non-idealities, resulting from the external mixer 462 mixing the received RF signal 431 and the LO signal 435, according to a predetermined frequency plan. Also, the controller 440 may consult a database of non-idealities based on a model of the external mixer 462 and choose the predetermined frequency plan according to the model.

The display 460 is configured to display a variety of features representative of functionality of the oscilloscope 400. For example, the display 460 may be configured to display the frequency downconverted IF signal 445 (frequency domain input signal) as a frequency spectrum which corresponds to the RF signal 431. The display 460 is also configured to display the logic levels from the logic domain input 420 as amplitudes versus time, where the amplitudes include high and low states. The display 460 may provide a time-aligned display of the logic levels and frequency domain signals, e.g., the frequency downconverted IF signal 445 corresponding to the RF signal 431 from the DUT 499.

Generally, enabling the oscilloscope 400 to generate the LO signal 435 internally simplifiers the system 40 for the user, since a separate signal generator is not required. Tight integration is achievable including smart power and LO connections, where characteristics of the chosen external mixer 462 may be communicated back to the controller 440 and/or the LO signal generator 433 to provide the correct power and frequency of LO signal 435 through to the external mixer 462 through the LO output port 434. Use of the controller 440, or other common control system as discussed above, enables synchronous adjustment of LO parameters to perform frequency sweeps and spur dodging, for example, discussed above. When the controller 440 software has full control over the LO signal generator 433 and associated control signals 441, the oscilloscope can also manage the frequency plan, as well as images and non-idealities associated with mixing by the external mixer 462. Much tighter time control can be achieved, thereby enabling the oscilloscope 400 to perform gated measurements that otherwise would be difficult using a separate LO signal generator, e.g., connected over a LAN to the oscilloscope 400 and the external mixer 462. Although FIG. 4 shows a single channel implementation, in which the frequency domain input 430 receives the frequency downconverted IF signal 445, various embodiments include a multi-channel implementation, using a common LO signal 35 for phase alignment, as well as separate LO signals for multiple frequency domain inputs, respectively.

Figure 5:
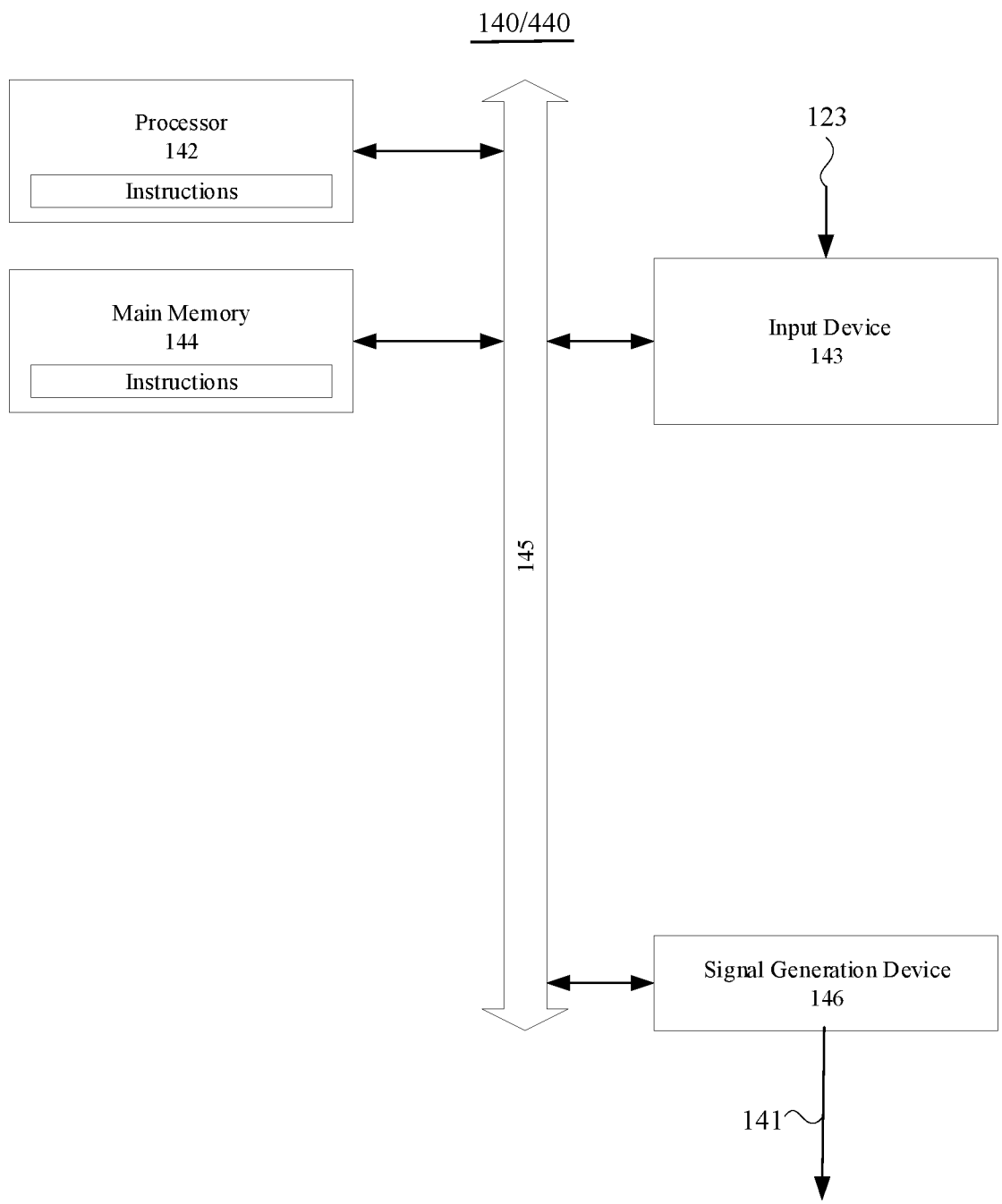
FIG. 5 illustrates a controller in a measurement instrument having time, frequency and logic domain channels, in accordance with a representative embodiment.

FIG. 5 illustrates a controller in a measurement instrument having time, frequency and logic domain channels, in accordance with a representative embodiment. The discussion of FIG. 5 references the controller 140, although it is understood that it applies equally to the controller 440, discussed above.

The controller 140 can include a set of instructions that can be executed, e.g., by a computer processor, to cause the controller 140 to perform any one or more of the methods or computer-based functions disclosed herein. The controller 140 may operate as a standalone device or may be connected, for example, using a network, to other computer systems or peripheral devices. Any or all of the elements and characteristics of the controller 140 in FIG. 5 may be representative of elements and characteristics of the controller 140 in FIG. 1 and the controller 440 in FIG. 4, or other similar devices and systems that can include a controller and perform the processes described herein.

In a networked deployment, the controller 140 may operate in the capacity of a client in a server-client user network environment. The controller 140 can also be fully or partially implemented as or incorporated into various devices, such as a central station, an imaging system, an imaging probe, a stationary computer, a mobile computer, a personal computer (PC), or any other machine capable of executing a set of instructions (sequential or otherwise) that specify actions to be taken by that machine. The controller 140 can be incorporated as or in a device that in turn is in an integrated system that includes additional devices. In an embodiment, the controller 140 can be implemented using electronic devices that provide video or data communication. Further, while the controller 140 is illustrated, the term "system" shall also be taken to include any collection of systems or sub-systems that individually or jointly execute a set, or multiple sets, of instructions to perform one or more computer functions.

As illustrated in FIG. 5, the controller 140 includes a processor 142. A processor 142 for a controller 140 is tangible and non-transitory. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. Any processor described herein is an article of manufacture and/or a machine component. A processor for a controller 140 is configured to execute software instructions to perform functions as described in the various embodiments herein. A processor for a controller 140 may be a general-purpose processor or may be part of an application specific integrated circuit (ASIC). A processor for a controller 140 may also be a microprocessor, a microcomputer, a processor chip, a controller, a microcontroller, a digital signal processor (DSP), a state machine, or a programmable logic device. A processor for a controller 140 may also be a logical circuit, including a programmable gate array (PGA) such as a field programmable gate array (FPGA), or another type of circuit that includes discrete gate and/or transistor logic. A processor for a controller 140 may be a central processing unit (CPU), a graphics processing unit (GPU), or both. Additionally, any processor described herein may include multiple processors, parallel processors, or both. Multiple processors may be included in, or coupled to, a single device or multiple devices.

Moreover, the controller 140 includes a main memory 144. The main memory 144 is representative of any memory included within a controller 140. In other words, the controller 140 is not limited to only a main memory 144, and may include multiple memories and multiple types of memories. Different elements of the controller 140 can communicate with each other via a bus 145. Memories described herein are tangible storage mediums that can store data and executable instructions and are non-transitory during the time instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted.

Although not shown, the controller 140 may further include or be connected to a video display unit, such as a liquid crystal display (LCD), an organic light emitting diode (OLED), a flat panel display, a solid-state display, or a cathode ray tube (CRT). Additionally, the controller 140 includes an input device 143 which receives the logic levels from the logic domain input 120. The controller 140 also includes a signal generation device 146 which outputs the control signals 141 based on the logic levels, in accordance with determinations by the processor 142.

Instructions stored in the processor 142 and/or the main memory 144 can be read. The instructions, when executed by the processor 142, can be used to perform one or more of the methods and processes as described herein. In an embodiment, instructions may reside completely, or at least partially, within the main memory 144, within another memory, and/or within the processor 142 during execution by the controller 140.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionality as described herein, and a processor described herein may be used to support a virtual processing environment.

Figure 6:
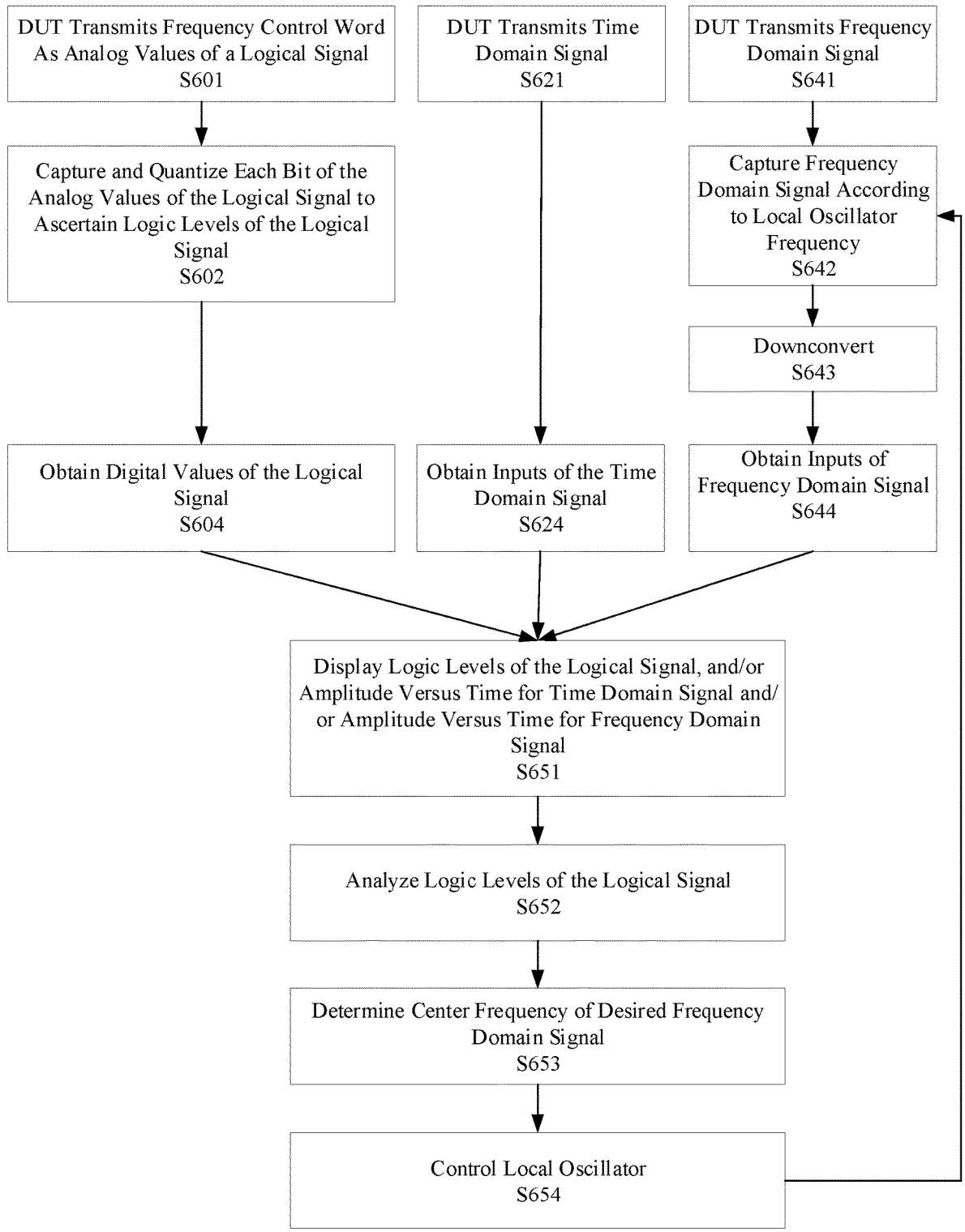
FIG. 6 illustrates an operational process for a measurement instrument having time, frequency and logic domain channels, in accordance with a representative embodiment.

FIG. 6 illustrates an operational process for a measurement instrument having time, frequency and logic domain channels, in accordance with a representative embodiment.

In FIG. 6, various subprocesses of the operational process illustrated therein may be performed fully or partially in parallel, such as fully or partially simultaneously. However, unless specified, simultaneous processing is not particularly required.

In FIG. 6, the DUT 199 transmits a frequency control word as analog values of a logical signal at S601. The analog values of the logical signal are captured and quantized by the logic domain input 120 at S602. At S604, digital values of the logical signal are obtained.

At S621, the DUT 199 transmits a time domain signal. The time domain input 110 obtains the inputs of the time domain signal at S624.

At S641, the DUT 199 transmits a frequency domain signal. The frequency domain signal is captured at S642 according to a local oscillator frequency of the LO signal 135, as varied by a LO signal generator. At S643, the captured frequency domain signal is downconverted. At S644, inputs of the frequency domain signal are obtained.

At S651, logic levels of the logical signal are displayed, such as on the display 160. As shown in FIG. 6, the process at S651 may also include displaying amplitude versus time, e.g., for the DUT time domain output signal 111, and/or amplitude versus time, e.g., for the DUT frequency domain output signal 131. At S652, the logic levels of the logical signal are analyzed, such as by the processor 142 of the controller 140. At S653, a center frequency of a desired frequency domain signal is determined, and at S654, the local oscillator is controlled in accordance with the center frequency determined at S653. The local oscillator S654 provides the LO signal 135 for use by the internal mixer 139 in capturing the frequency domain signal according to the local oscillator frequency indicated by the LO signal 135.

Figure 7:
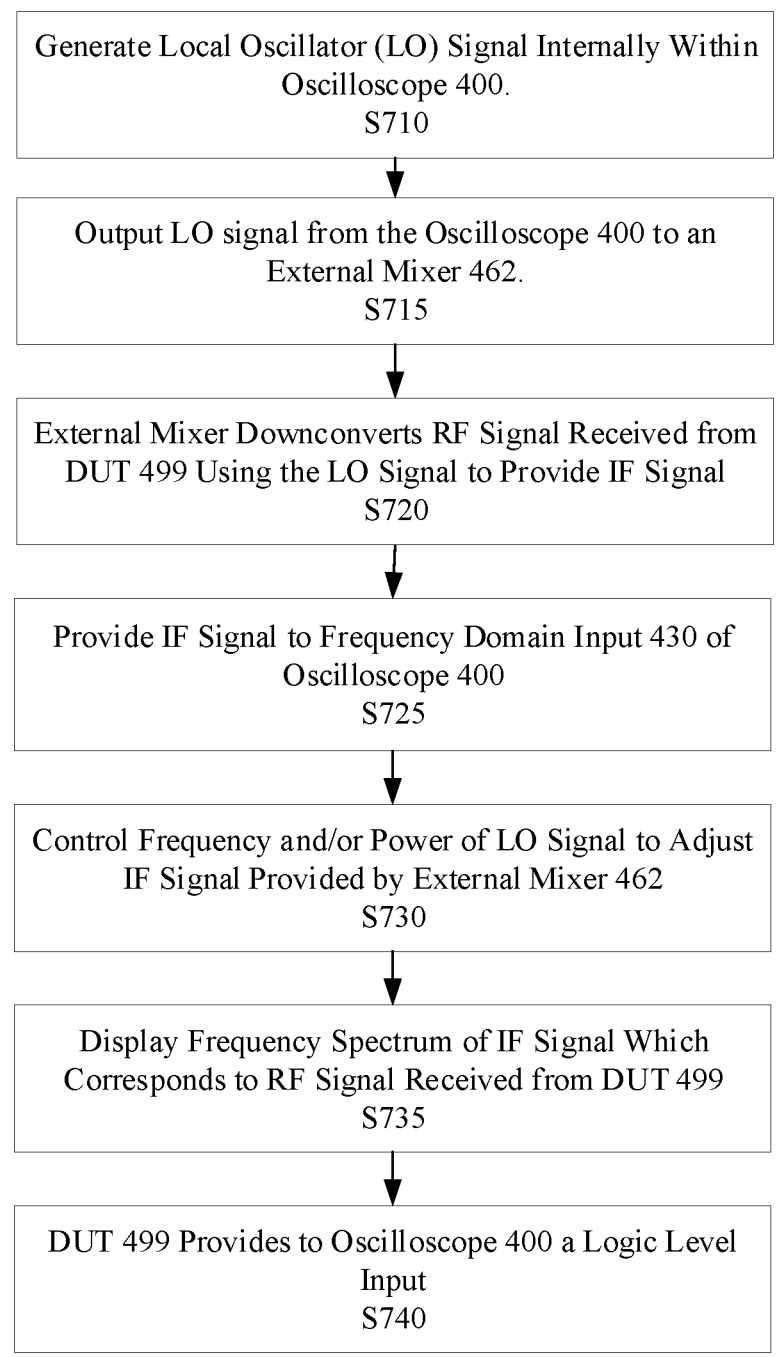
FIG. 7 illustrates another operational process for a measurement instrument having at least time and frequency domain channels, an internal LO signal generator and LO port, in accordance with a representative embodiment.

FIG. 7 illustrates another operational process for a measurement instrument having at least time and frequency domain channels, as well as an internal (integrated) LO signal generator and an LO output port for outputting an LO signal generated by the LO signal generator, in accordance with a representative embodiment. In the depicted process, it is assumed that the measurement instrument also includes a logic domain channel.

Referring to FIG. 7, at S710, the oscilloscope 400 generates the LO signal 435 internally. For example, the oscilloscope 400 may include the integrated LO signal generator 433 for generating the LO signal 435 internally. At S715, the LO signal 435 is output from the oscilloscope 400 to the external mixer 462 through LO output port 434. The external mixer 462 is external to the oscilloscope 400.

At S720, the external mixer 462 downconverts the RF signal 431 received from the DUT 499, by mixing the LO signal 435 received from the integrated LO signal generator 433 and the RF signal 431, in order to provide the frequency downconverted IF signal 445. The LO signal generator 433 may be controlled based on logic levels provided via the logic domain input 420 to manage the downconversion of the frequency downconverted IF signal 445, e.g., through frequency adjustment of the LO signal 435.

At S725, the frequency downconverted IF signal 445 is received by the frequency domain input 430 of the oscilloscope 400. The frequency downconverted IF signal 445 represents the original frequency domain signal from the DUT 499 (RF signal 431).

At S730, the frequency and/or power of the LO signal 435 may be controlled to adjust the downconverted IF signal 445 provided by the external mixer 462 to the frequency domain input 430. As will be evident, S730 is not necessarily performed after S725 and other steps of FIG. 7 already described. Rather, S730 may be performed on an ongoing basis, such as commensurate with S710 in order to control the frequency and/or power of the LO signal 435 when the LO signal 435 is generated within the oscilloscope 400. For example, as discussed above, when frequency hopping is performed by the DUT 499, the LO signal generator 433 may be controlled to synchronously hop frequencies of the LO signal 435 so that the resulting frequency downconverted IF signal 445 remains substantially the same at the different frequencies of the RF signal 431. Additionally, the process at S730 is optional in that the adjustment of a downconverted IF signal 445 is not necessary in order to perform other processes shown in FIG. 7 and described herein.

At S735, a frequency spectrum of the frequency downconverted IF signal 445 is displayed, such as by the display 460. The frequency spectrum of the frequency downconverted IF signal 445 corresponds to the RF signal 431 input to the external mixer 462. When frequency hopping is performed by the DUT 499, and managed by synchronously adjusting the frequency of the LO signal 435, the frequency hopping is effectively removed in the frequency downconverted IF signal 445.

At S740, the oscilloscope 400 of FIG. 4 may optionally receive a logic level input provided via multiple logic domain input 420 over time in various embodiments. An example of the logic level input may be a FCW, which represents the center frequency of a hopped signal (e.g., the RF signal 431) from DUT 499. In other words, the logic level input may be sent from the DUT 499 to coordinate acquisitions with the oscilloscope 400 in advance, such as by using a predetermined pattern expressed by the FCW. S740 is not necessarily performed after S735 and other steps of FIG. 7 already described.

Figure 8:
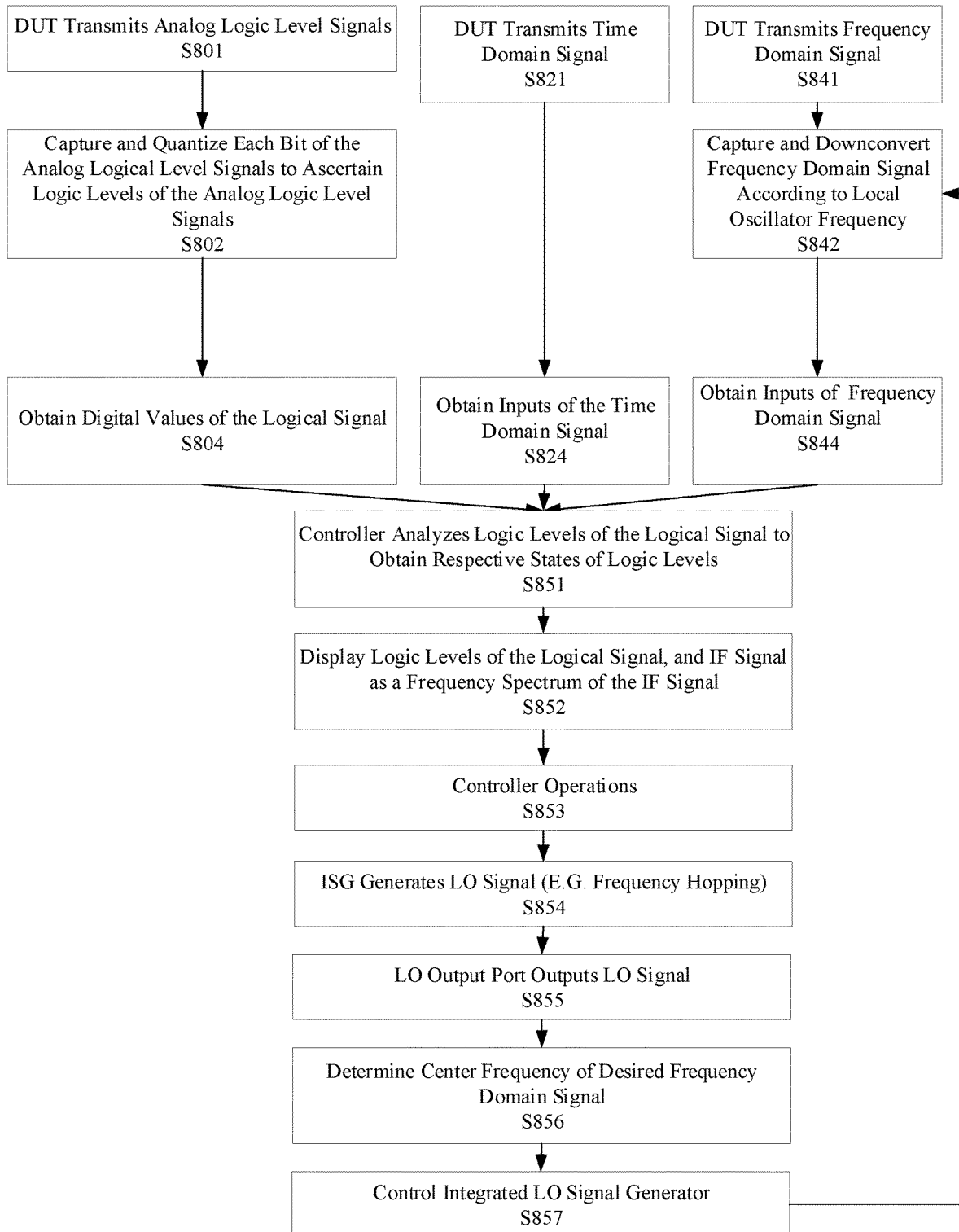
FIG. 8 illustrates another operational process for a measurement instrument having at least time and frequency domain channels, an internal LO signal generator and LO port, in accordance with a representative embodiment.

FIG. 8 illustrates another operational process for a measurement instrument having time and frequency domain channels, as well as an internal (integrated) LO signal generator and an LO output port for outputting an LO signal generated by the LO signal generator, in accordance with a representative embodiment. In the depicted process, it is assumed that the measurement instrument also includes a logic domain channel.

In FIG. 8, processes for logic domain input 420, the time domain input 410 and the frequency domain input 430 are shown in parallel prior to S851. However, the processes do not have to occur in parallel, and may instead be partially commensurate or not commensurate at all.

At S801, the DUT 499 transmits analog logic level signals to the oscilloscope 400. At S802, each bit of the analog logic level signals is captured and quantized at the logic domain input 420 to ascertain logic levels of the analog logic level signals. At S804, digital values of the logical signal are obtained.

At S821, the DUT 499 transmits a time domain signal to the oscilloscope 400. At S824, inputs of the time domain signal are obtained by the time domain input 410 of the oscilloscope 400.

At S841, the DUT 499 transmits a frequency domain signal, the RF signal 431, to the external mixer 462. At S842, the external mixer 462 captures and downconverts the frequency domain signal from the DUT 499 by frequency mixing it with the LO signal 435 output by the LO signal generator 433, to obtain the frequency downconverted IF signal 445. As described above, the LO signal 435 itself may be adjusted in response to the digital values of the logical signal obtained at S804. At S844, the frequency domain input 430 obtains the inputs of the frequency downconverted IF signal 445. The inputs of the downconverted IF signal 445 are representative of the original frequency domain signal from the DUT 499, e.g., prior to hopping and any frequency upconversion by the DUT 499.

At S851, the controller analyzes logic levels of the logical signal obtained at S804, to obtain respective states of the logic levels. At S852, the display 460 displays logic levels of the logical signal, and/or a frequency spectrum of the frequency downconverted IF signal 445.

At S853, one or more controller operations are performed by the controller 440. Examples of controller operations performed by the controller include the following. The controller 440 may control at least one parameter of the frequency domain input signal (e.g., the frequency downconverted IF signal) in response to respective states of the logic levels from the logic domain inputs. The at least one parameter may be or include, for example, frequency and/or amplitude of the frequency domain input signal. The controller 440 may synchronously adjust parameters of the integrated LO signal generator 433 to enable frequency hopping and/or sweeping of the LO signal 435. The controller 440 may control frequency offsets of the LO signal 435 for spur dodging. The controller 440 may receive a characteristic of the external mixer 462 through an auxiliary control signal 463 received from the external mixer 462 as a received characteristic, and may adjust the integrated LO signal generator 433 to alter at least one of frequency and power of the LO signal 435 in response to the received characteristic from the external mixer 462. The controller 440 may control the integrated LO signal generator 433 to generate the LO signal 435 (or multiple such signals) having different frequencies at different times according to a predetermined frequency plan. The controller 440 may manage images and non-idealities resulting from the external mixer 462 mixing the RF signal 431 and the LO signal 435, according to a predetermined frequency plan. The controller 440 may, for example, consult a database of non-idealities based on a model of the external mixer and choose the predetermined frequency plan according to the model.

At S854, the integrated LO signal generator 433 generates the LO signal 435. As an example, the LO signal 435 may vary according to frequency hopping as instructed by a FCW provided in the analog logic level signals from the DUT 499.

At S855, the LO output port 434 outputs the LO signal 435 to the external mixer 462 external to the oscilloscope

400. At S856, the center frequency of the desired frequency domain signal input at S842 is determined by the controller 440, such as based on the FCW from the DUT 499. At S857, the integrated LO signal generator 433 is controlled to emit the LO signal 435 using the center frequency of the desired frequency domain signal as determined by the controller 440 at S856.

As described above, a measurement instrument having time, frequency and logic domain channels enables an oscilloscope 400 to process mmWave RF signals even when bandwidths much larger than 2 GHz are used by DUT 499. A mixer such as external mixer 462 external to the oscilloscope 400 can be used for the frequency downconversion. Moreover, analog logic level signals input to a logic domain input can be used to enable processing of frequency-hopped spread spectrum signals even when the oscilloscope 400 is provided with the time domain input 410 and the frequency domain input 430.

Although measurement instrument having time, frequency and logic domain channels has been described with reference to several exemplary embodiments, it is understood that the words that have been used are words of description and illustration, rather than words of limitation. Changes may be made within the purview of the appended claims, as presently stated and as amended, without departing from the scope and spirit of measurement instrument having time, frequency and logic domain channels in its aspects. Although measurement instrument having time, frequency and logic domain channels has been described with reference to particular means, materials and embodiments, measurement instrument having time, frequency and logic domain channels is not intended to be limited to the particulars disclosed; rather measurement instrument having time, frequency and logic domain channels extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A measurement apparatus, comprising:
   a time domain receiver configured to receive a time domain input signal in a time domain;
   a logic domain receiver configured to receive a logical signal comprising logic levels over time;
   a frequency domain receiver configured to receive a frequency domain signal in a frequency domain through frequency downconversion; and
   a controller coupled to the logic domain receiver, and configured to control, based on logic levels of the logical signal over time, at least one parameter of the frequency domain signal,
   wherein the frequency domain receiver is further configured to receive the frequency domain signal at acquisition frequencies controlled by the controller in accordance with the logic levels of the logical signal.

2. The measurement apparatus of claim 1, wherein the at least one parameter controlled by the controller includes an acquisition frequency of the frequency domain signal which is subject to frequency downconversion.

3. The measurement apparatus of claim 1, wherein the controller includes a memory that stores instructions and a processor that executes the instructions to control, based on the logic levels of the logical signal over time, the at least one parameter of the frequency domain signal.

4. The measurement apparatus of claim 1, wherein the logic domain receiver comprises a one-bit quantizer, wherein the logical signal is determined to be a logic zero when the logical signal is below a threshold and a logic one when the logical signal is above the threshold.

5. The measurement apparatus of claim 1, wherein the frequency domain signal comprises a hopped frequency domain signal.

6. The measurement apparatus of claim 5, wherein the logic levels comprise a frequency control word (FCW) representing a center frequency of the hopped frequency domain signal.

\* \* \* \* \*